United States Patent [19]
Satou et al.

[11] Patent Number: 5,612,571
[45] Date of Patent: Mar. 18, 1997

[54] SPUTTERED SILICIDE FILM

[75] Inventors: Michio Satou; Takasi Yamanobe; Mituo Kawai, all of Yokohama; Tooru Komatu, Yokosuka; Hiromi Shizu, Fujisawa; Noriaki Yagi, Yokohama, all of Japan

[73] Assignee: Kabushiki Kaisha Toshiba, Kawasaki, Japan

[21] Appl. No.: 512,911

[22] Filed: Aug. 9, 1995

Related U.S. Application Data

[62] Division of Ser. No. 345,405, Nov. 21, 1994, Pat. No. 5,508,000, which is a division of Ser. No. 793,384, Mar. 13, 1992, Pat. No. 5,409,517.

[30] Foreign Application Priority Data

May 15, 1990 [JP] Japan ..................... 2-123054

[51] Int. Cl.$^6$ ............. H01L 23/48; H01L 23/52; H01L 29/40
[52] U.S. Cl. ............................ 257/757; 257/768
[58] Field of Search ................. 257/757, 296, 257/768, 646; 75/228

[56] References Cited

U.S. PATENT DOCUMENTS

| | | | |
|---|---|---|---|
| 4,886,764 | 12/1989 | Miller et al. | 257/757 |
| 5,135,685 | 10/1992 | Murata et al. | 257/296 |
| 5,409,517 | 4/1995 | Satou et al. | 75/228 |

Primary Examiner—Sara W. Crane
Assistant Examiner—Adriana Giordana
Attorney, Agent, or Firm—Oblon, Spivak, McClelland, Maier & Neustadt, P.C.

[57] ABSTRACT

According to the present invention, metal silicide grains are coupled with each other in a linked manner so as to provide a metal silicide phase, and Si grains forming a Si phase are dispersed in the gaps of the metal silicide phase discontinuously so as to provide a mixed structure of a sputtering target of high density and containing carbon at a rate less than 100 ppm. Because of the high density and high strength of the target, generation of particles at the time of sputtering can be reduced, and because of the reduced content of carbon, mixing of carbon in a thin film formed by the sputtering can be prevented.

20 Claims, 6 Drawing Sheets

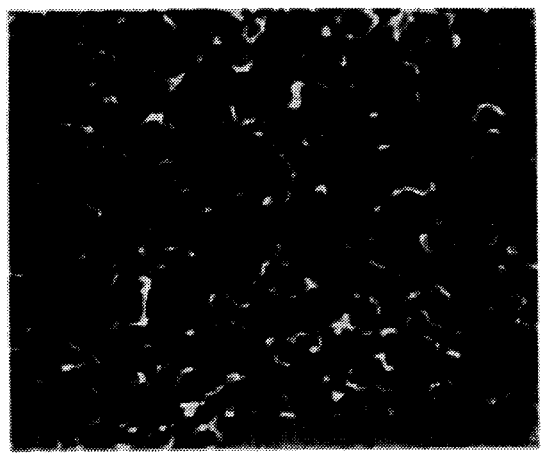
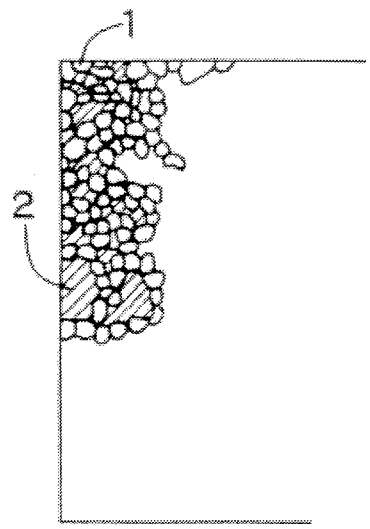
FIG. 1A  FIG. 1B
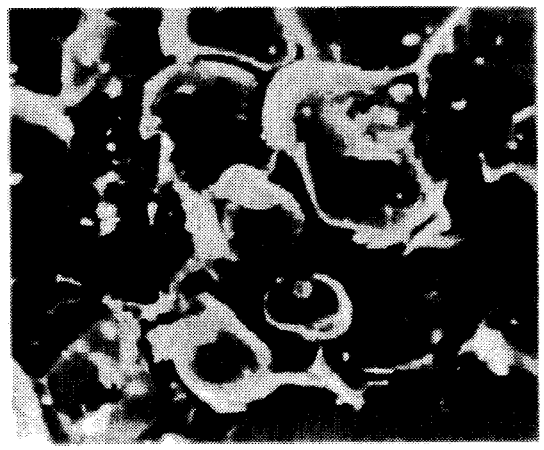
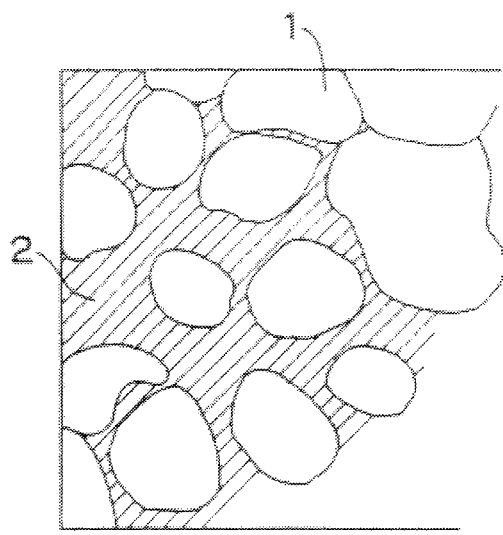
FIG. 2A  FIG. 2B

 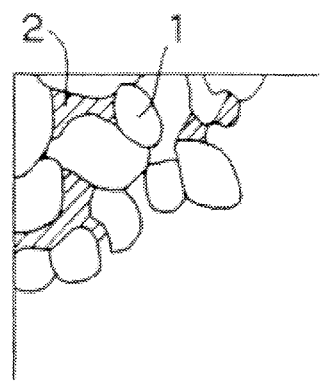
FIG. 3A  FIG. 3B
 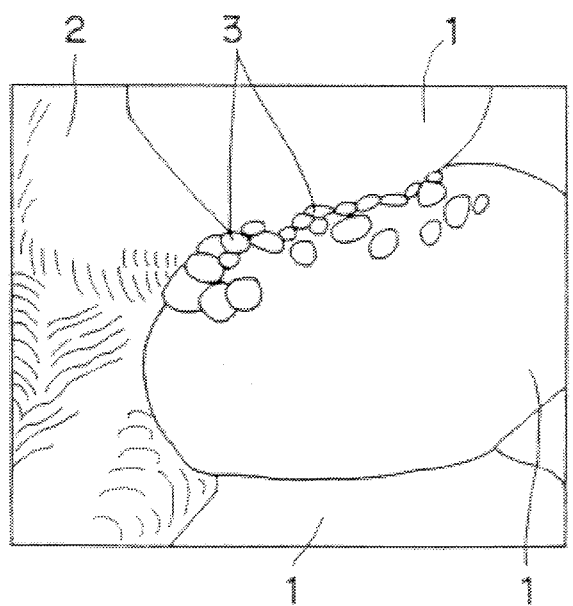
FIG. 4A  FIG. 4B

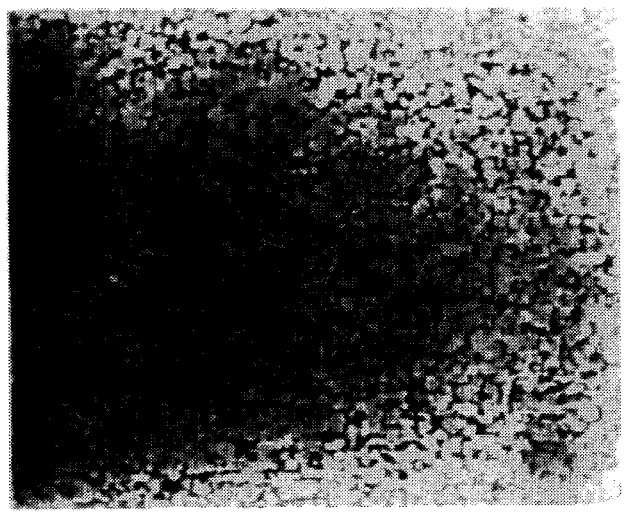
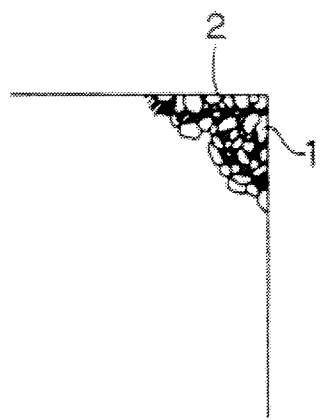
FIG. 7A  FIG. 7B
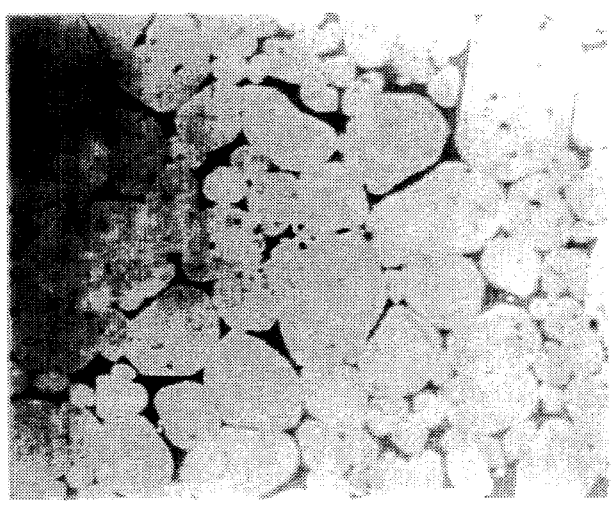
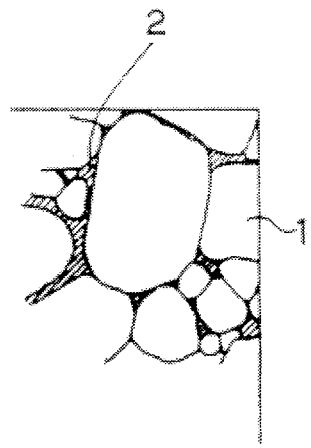
FIG. 8A  FIG. 8B

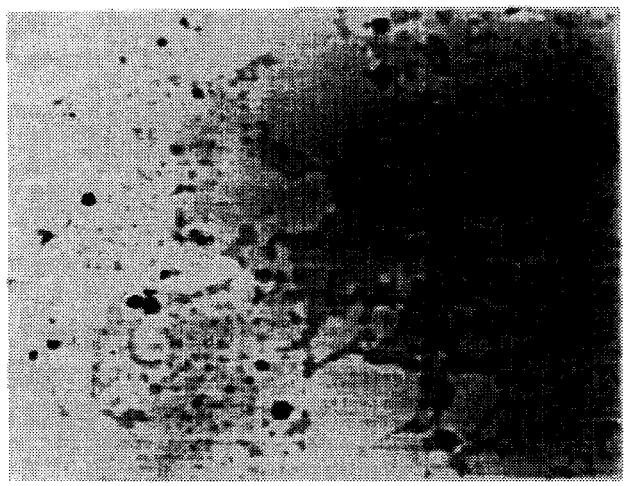
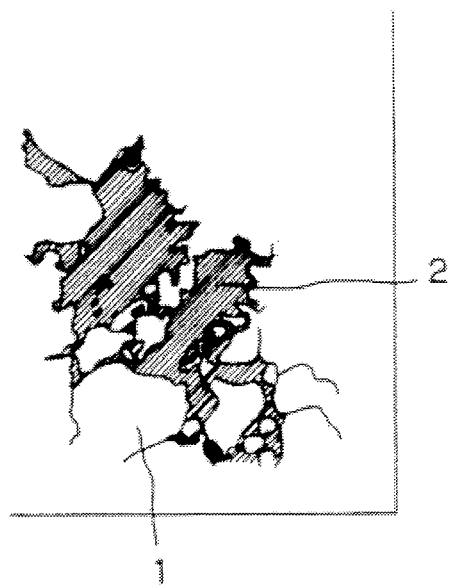
FIG. 9A  FIG. 9B
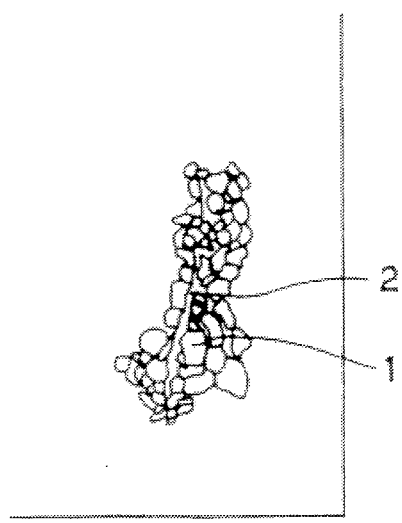
FIG. 10A  FIG. 10B levels, the sheet resistance of the resultant thin film can be maintained in a low level.

SPUTTERED SILICIDE FILM

This is a Division of application Ser. No. 08/345,405, filed on Nov. 21, 1994, now U.S. Pat. No. 5,508,000, which is a divisional of application Ser. No. 07/793,384, filed on Mar. 13, 1992, which was filed as International Application No. PCT/JP91/00639, filed on May 15, 1991, now U.S. Pat. No. 5,409,517.

TECHNICAL FIELD

The present invention relates to a sputtering target and a method of manufacturing the sputtering target. More specifically, to a sputtering target of high density and high quality adapted to be used for forming thin films as electrodes and wiring members of semiconductor devices, and a method of manufacturing this type of sputtering target.

BACKGROUND TECHNIQUES

Sputtering method has been heretofore used in forming electrodes or wirings of semiconductor devices. Since the method is advantageous for mass-production, and for assuring safety of the film thereby produced, it has been used where argon ions are forced to collide against refractory metal silicide type target so as to release the metal, and to deposit the same on a substrate opposing to the target in the form of a thin film. Thus, it is apparent that the property of the silicide film formed by sputtering substantially depends upon the property of the target.

However, according to increase in degree of integration and minimization of the integrated semiconductor elements, reduction of particles (minute grains) generated from the sputtering target, in a case of forming a refractory metal silicide thin film, is urgently demanded. The reason of this resides in that the minute particles of approximately from 0.2 to 10 µm generated from the target during the sputtering process tend to be mixed in the deposited thin film, and to cause shortage or disconnection of wiring when the semiconductor device is practically used in a circuit, thus reducing the production yield of the target.

Conventionally, various methods have been proposed for manufacturing targets of high density, and the structure of which is made compact and fine, so that the amount of particles generated from the target is reduced.

For instance, Japanese Patent Laid-Open No. 179534/1986 discloses a method wherein a melted Si is impregnated in a semi-sintered raw material made of a refractory metal component (M) and Si component. According to this method, a structure having spherical or oval shaped $MSi_2$ of grain diameter 5 to 500 µm dispersed in continuous matrices of Si is obtained, and the amount of contained impurities such as carbon and oxygen is held less than 50 ppm.

On the other hand, Japanese Patent Laid-Open No. 219580/1988 discloses a technique wherein a mixture made of a refractory metal (M) and Si is subjected to a silicide reaction under a high vacuum thereby forming a semi-sintered substance, and this substance is thereafter subjected to a hot isostatic press sintering process for obtaining high density of target. In this case, a compact structure with the maximum grain size of $MSi_2$ held less than 20 µm and the maximum grain size of free Si held less than 50 µm is obtained. This target has a mixed structure of minute $MSi_2$ grains and free Si grains dispersed with each other, and the containing amount of Oxygen set less than 200 ppm. Since the Oxygen content of the target is thus suppressed to a low Furthermore, Japanese Patent Laid-Open Nos. 179061/1988 and 39374/1989 disclose a technique wherein a powdered mixture of a refractory metal (M) and Si is subjected to a silicide reaction under high vacuum, so as to obtain a sintered substance, and this substance is pulverized and added with a composition adjusting silicide powder, and then subjected to a hot-press sintering process so as to obtain a target of high density and Si coagulation suppressed.

However, in the case of the method wherein melted Si is impregnated in a semi-sintered substance, it is found that although a high density target can be obtained as a result of substantial reduction of impurity contents such as carbon, oxygen and the like. The silicon (Si) impregnated in the semi-sintered substance tends to drop out continuously so as to form a matrix; and also that since coarse and large Si portions are formed by Si impregnated in large voids formed in the semi-sintered substance, the Si having a rigidity comparatively smaller than the metal silicide tends to be broken down by the thermal stress caused during the sputtering process, and furthermore since the Si is provided continuously, the strength of the entire target is made insufficient.

Thus, the metal silicide is easily collapsed, and a great number of particles are thereby produced.

In case of the method wherein a semi-sintered substance formed by use of pulverized Si powder as it is for press-sintering, it is also found that although a target of high density and compact structure can obtained, contaminating carbon mixed during the pulverizing process of Si is not removed, but it remains in the target, and therefore during the sputtering operation, sputtering drops are not sputtered sufficiently from a portion containing much carbon, thus causing generation of particles, and furthermore there is a problem that the carbon containing portion formed in the thin film is hardly etched, thus resulting etchant remain and dis-connection of wiring.

In addition, it is also found that in the case where the pulverized Si powder is formed into a semi-sintered substance, and the semi-sintered substance is pulverized, but as it is subjected to press-sintering although a target of high density and compact structure can be obtained, carbon adversely mixed during the pulverizing step of Si is not removed, but is remained in the target. As a consequence, there arises further problem that sputtering drops are not sufficiently sputtered at a portion containing large amount of carbon, and furthermore, a portion of the thin film containing carbon is hardly etched, thus causing presence of residual etchant, and disconnection of wiring.

In the case where pulverized Si powder is formed into a semi-sintered substance, thus obtained semi-sintered substance is again pulverized, a composition adjusting silicide power is added thereto, and the entirety is subjected to a hot-press sintering process; it is also found that although a target of high density and fine structure can be obtained, not only contamination of the material due to carbon increases, but also the content oxygen mixed into the material increases because of the two crashing steps, Accordingly, the generated amount of particles increases, and the electric resistance of the thin film increases because of oxygen mixed in the thin film.

Even in the case of high density target having a density ratio of 99%, it is also confirmed that the generated amount of particles tends to increase under the effect of a specific impurity, and waste products are liable to increase rapidly at a time when a wiring pattern is formed by etching on the thin film.

Heretofore, in view of easiness of control of the composition of the silicide film, a sputtering target manufactured according to a powder-sintering method has been ordinarily used. More specifically, the conventional metal silicide target has been produced by a method wherein a metal silicide (hereinafter noted $MSi_2$) obtained by reaction Synthesizing metal powder (M) of tungsten, molybdenum and else with silicon power (Si) is subjected together with Si to hot-press or hot isostatic press (Japanese Patent Laid-Open Nos. 141673/1986, 141674/1986, and 178474/1986 and else) or a method wherein Si is impregnated into a silicide semi-sintered substance (Japanese Patent Laid-Open No. 58866/1986).

However, in the case of the former method, since the sintered substance is provided by adding Si powder to synthesized $MSi_2$ powder, in a case of sintered substance of, for instance, a composition containing $MSi_{2.2}$ - $MSi_2$ the occupied volume ratio of Si phase is held in a range of 8% to 25%, much smaller than that of the $MSi_2$ phase. Accordingly, in order to sufficiently distribute the Si phase around $MSi_2$ grains of angular shape obtained by pulverizing, a procedure depending on the press sintering is not sufficient, and a target having defective and nonuniform structure such as including coagulated portion of angular $MSi_2$ grains and localized portion of Si phase is thereby obtained.

On the other hand, melting point of the $MSi_2$ phase is much different depending on the kind of the metal M. For instance, the melting points of $WSi_2$, $MoSi_2$, $TiSi_2$ and $TaSi_2$ are 2165° C., 2030° C., 1540° C. and 2200° C., respectively. In a case where an $MSi_2$ having melting point thus differing in a wide range and the Si phase of a melting point of 1414° C. are press-sintered at a temperature lower than the eutectic temperature, sintering does not progress between $MSi_2$ grains of thermally stable, thus reducing the combining strength between grains substantially, and rendering the products to be brittle. Further the remaining pores render the compactness of the structure to be insufficient.

When a silicide film is formed by sputtering utilizing the thus obtained target, the combination between grains tends to be broken by irradiating energy of argon ions, and particles are generated from the sputtering surface of the target due to breakage and collapse starting from the aforementioned defective portions.

Particularly in a case of a high density integrated circuit and the like, the width of electrodes and the spacing between wirings are minimized in accordance with an increase in degree of integration from 4 Mega to 16 Mega, and therefore, the particles mixed in the deposited thin film deteriorates the yield of production rapidly.

In the case of the latter-mentioned conventional method, the composition of the target is controlled by impregnated melted Si in the silicide semi-sintered substance which has been before hand controlled to a predetermined density. However, in a case where $MSi_2$ is synthesized by silicide reaction between the M powder and Si powder for obtaining a semi-sintered substance of a predetermined density, or where a semi-sintered substance or a predetermined desntiy is formed by the sintering process of press-formed $MSi_2$, the density is varied depending on the treating temperature and time and the pressing pressure, so that it is extremely difficult to obtain a target of a desired composition.

According to the knowledge of the inventor of this invention, since the powdered $MSi_2$ and Si to be used as materials are of high purity, there is no tendency of impurities being collected by diffusion in the boundary between $MSi_2$ phase and Si phase of the target, and therefore the interface bonding strengths between the $MSi_2$ phase and the Si phase, and between different $MSi_2$ phases are made weak.

In addition, there is problem that the sputtering operation becomes unstable, because the difference in electric resistance between the $MSi_2$ phase and Si phase is extremely large. More specifically, the electric resistances of $WSi_2$, $MoSi_2$, $TiSi_2$, $TaSi_2$, constituting the $MSi_2$ are 70, 100, 16 and 45 $\mu\Omega.cm$ of comparatively small values, respectively, while the electric resistance of the Si phase is extremely large value of $3\times10^{10}$ $\mu\Omega.cm$. Further, there is no interface layer between the $MSi_2$ phase and the Si phase, so that the electric resistance in the boundary portion changes abruptly. Particularly in the structure of the target manufactured in accordance with the latter method, it is held in a state that Si phase of high resistance is directly in contact with the $MSi_2$ phase of low resistance.

Accordingly, when sputtering is carried out by use of such target, insulation break-down between the $MSi_2$ phase and the Si phase inevitably occurs under a voltage larger than a predetermined value, and an electric current starts to flow abruptly. That is, when the voltage becomes more than a predetermined value, discharge of electricity occurs, and $MSi_2$ grains of weak interface bonding strength or parts made of Si phase are liable to be collapsed, thus generating the particles.

This invention is made in view of the above described difficulties of prior art, and the object of the invention is to provide a sputtering target of high quality capable of substantially preventing generation of particles, and capable of forming a thin layer of high quality. Another object is to provide a method for manufacturing such a sputtering target.

DISCLOSURE OF THE INVENTION

According to the present invention, there is provided a sputtering target characterized in that metal silicide (of a stoichiometric composition expressed by $MSi_2$ where M designates a metal) is coupled together in a link form to provide a metal silicide phase Si; phase made of Si grains is dispersed in the gaps of the silicide phase discontinuously so as to provide a compact mixed structure of the target; and carbon content in the structure is restricted less than 100 ppm.

Further, metal silicide grains of a number falling in a range of from 400 to $400\times10^4$, each having a grain diameter of from 5 to 30 μm, are provided in a sectional area of 1 $mm^2$ of the mixed structure, and the maximum grain diameter of Si is restricted less than 30 μm.

Preferably, the average diameter of the metal silicide grains is held in a range of from 2 to 15 μm, whale the average diameter of the Si grains is held in a range of from 2 to 10 μm.

In the above description, grain diameter is defined to be a diameter of a smallest circle circumscribing the grain.

Preferably, the density ratio of the target is more than 99%, and oxygen content is restricted less than 150 ppm.

Further, the metal (M) forming the metal silicide is at least one kind selected from a group of tungsten, molybdenum, titanium, zirconium, hafnium, niobium, tantalm, vanadium, cobalt, chromium and nickel.

Preferably, an interface layer is formed between the metal silicide phase and the Si phase, and the thickness of the interface layer is set in a range of from 100 to 10000 Å.

Preferably, the Si phase contains at least one kind of element selected from a group of B, P, Sb and As, and unavoidably contained elements, and the electric resistivity of the Si phase is restricted in a range of from 0.01 to 100 Ω.cm.

Further, there is provided a sputtering target manufacturing method of this invention, capable of manufacturing a sputtering target, wherein metal silicide (of a stoichiometric composition expressed by $MSi_2$, where represents a metal) is coupled with each other in a link form to provide a metal silicide phase, a Si phase made of Si grains is held in the gaps of the silicide phase discontinuously so as to provide a compact and minute mixed structure of the target, and carbon content in the structure is restricted less than 100 ppm.

Preferably, the method for manufacturing the sputtering target comprises:

I. a step of mixing metal powder (M) and Si powder (Si) at a Si/M atomic ratio ranging from 2.0 to 4.0 so as to form a mixed powder;

II. a step of filling the mixed power in a mold, and reducing carbon and oxygen contents by heating the entirety in high vacuum at a comparatively low temperature;

III. a step wherein the mixed power is heated in high vacuum and under a low pressure to execute synthesis and sintering of the metal silicide; and IV. a step wherein the resultant material is further heatd in an atmosphere of high vacuum or an inert gas and under a high press-pressure, to a temperature just below the enectic point, so that the compactness of the material is promoted.

Preferably, the metal powder (M) used in this method is a high purity metal powder having maximum grain diameter less than 10 μm, while the Si powder (Si) is a high purity Si powder having maximum grain diameter less than 30 μm.

Further, it is characterized that the mixed powder made of the metal powder (M) and the Si power (Si) is subjected to a reaction-melting-sintering process, so that silicide-synthesis, sintering and tightening of structure are carried out simultaneously.

Further, the aforementioned reaction-melting-melting-sintering process may be executed by use of a hot-press method or a hot isostatic press method.

The inventors of this invention have analyzed the reason of generating particles in the metal silicide target made of sintered alloy from various point of view, and completed this invention based on the knowledge obtained by the analyzed results. More specifically, based on the judgement that the particles generated heretofore in the refractory metal silicide target produced by powder sintering method are induced as a result of abnormal electric discharge occurring in the pores (or voids) produced in the target, and thereby collapsing the surrounding portions of these pores, various efforts have been exercised for improving the density of the target and for reducing the number of pores.

However, according to further study pursued by the inventors for clarifying the generating reason of the particles in the refractory metal silicide target, various reasons such as collapse of eroded Si portion due thermal stresses, collapse of the $MSi_2$ phase due to the difference in sputtering rate between the $MSi_2$ phase and Si phase, and else are found besides of the particles caused by the pores. To cope with the temperature rise caused by continuous bombard of high speed argon ions, the surface of the target is cooled from the rearside. Thus thermal stresses created by the thicknesswise temperature difference and thermal deformation of the target act on the surface of the target, and as a consequence, Si phase having a strength weaker than that of the $MSi_2$ phase is broken down to produce the particles. Particularly, the eroded surface of Si phase is much coaser than the rather flat surface of the $MSi_2$ phase, and the projecting portions of the Si phase tend to be collapsed by thermal stress or deformation stress caused by sputtering cycles so as to easily produce particles. Further, Si phase is eroded by sputtering in preference over $MSi_2$ phase, and when MSi, phase is provided within continuously distributed Si phase, a force for seizing the $MSi_2$ phase is reduced according to the erosion of the Si phase, and $MSi_2$ phase is collapsed, in the form of single grains or combined grains, thereby to produce particles.

The inventors of this invention find out that the generation of the particles caused by the collapse of $MSi_2$ phase, which has been caused by the erosion of Si phase owing to the thermal stresses or by the difference in sputtering rate between the $MSi_2$ phase and Si phase, can be substantially suppressed by a mixed construction of sputtering target wherein the Si phase easily broken is made minute, and thus minute formed Si phase is distributed discontinuously in the $MSi_2$ phase also minute formed and coupled in an interlinked manner.

Furthermore, the inventors of this invention paid attention to carbon mixed in the target and liable to act as a particle generating source. More specifically, when the eroded surface of the target is observed on a magnified scale after the sputtering operation, it was found that the portion contaminated by carbon was not sputtered sufficiently, but remained in a projecting manner from the eroded surface, thus rendering plasma-discharge unstable so as to repeat abnormal discharge, and causing generation of the particles.

The inventors also confirmed by experiments that the amount of carbon contained in the target widely affects the etching property of a silicide thin film formed by sputtering. More specifically, with carbon combined with Si component tends to produce SiC of highly insulative property. The presence of SiC and mixing thereof into the thin film tends to reduce the etching property of the thin film abruptly. More specifically, at a time when a circuit pattern is formed on a substrate applied with a photoresist by means of a light exposing device, and the pattern is developed by a predetermined agent for obtaining a circuit pattern of an integrated circuit (IC) by etching the substrate formed with a thin film, the ratio of remaining SiC as a residue increases, and the provability of occurring defective circuit pattern and discontinuity of circuit increases.

In addition, the carbon deposits mixed in the silicide film in the form of particles have a light reflexibility different from other regions, and are easily exposed to light. As a consequence, regions having light reflexibility locally different are formed on the surface of the film, and providing a uniform and high precision circuit pattern is thereby made difficult.

The inventors of this invention also paid attention to projecting portions created in the $MSi_2$ phase and Si phase as another source for generating particles. When the eroded surface of a metal silicide target manufactured by a conventional method is magnified and observed by a scanning type electron microscope (SEM), it is found that a great number of minute projecting portions 3 are formed on the surface of coarse $MSi_2$ phase grain and Si phase grain as shown in FIGS. 11A, 11B, and 12A, 12B, and that there is a close relation between the provision of the projecting portions and the amount of the generated particles. Further study also reveals that the projecting portions are reduced in accordance with the reduction of grain diameters of the $MSi_2$ phase and Si phase, and when the maximum grain diameter of MSi phase is selected less than 10 μm, and the maximum grain diameter of Si phase is selected less than 20 μm, generation of particles can be suppressed substantially.

As a result of further study for obtaining a sputtering target of high density and having a minute structure and least carbon contents, following facts are made apparent, and the invention is thereby completed.

Where a mixed powder made of minute M powder and Si powder is placed in a mold and heated under high vacuum, and then subjected to a silicide reaction under a low press-pressure, and further thus obtained metal silicide sintered under a high press-pressure; carbon contained in Si surface reacts with oxygen at a temperature lower than 1300° C. rendering Si evaporation to be significant, and carbon and oxygen contained in the resultant product are reduced in the form of CO or $CO_2$;

Oxygen contained in Si surface tends to react with Si to form SiO or $SiO_2$ gas, so that the oxygen contents are also reduced in this manner;

Metal (M) is entirely made into minute $MSi_2$;

A mixed structure wherein $MSi_2$ is coupled in a link form, and Si is distributed discontinuously in the gaps of the link connections can be thereby obtained; and Elimination of pores and tightness of the structure are promoted at a temperature just below the entectic point.

Inventors also find out that by providing an interface layer containing at least one kind of element selected from a group consisting of boron (B), phosphorus (P), antimony (Sb) and arsenic (As) between $MSi_2$ phase and Si phase, coupling strength between these two phases is increased, and abrupt change in electric resistance can be avoided, thus realizing reduction of particle generation.

Herein, metals (M) such as molybdenum (Mo), tungsten (W), titanium (Ti), zirconium (Zr), hafnium (Hf), niobium (Nb), tantalum (Ta), vanadium (V), cobalt (Co), chromium (Cr), nickel (Ni) and the like capable of forming a metal silicide thin film of a comparatively small specific resistance are used singly or in combination of two or more kinds for forming the target, and it is particularly advantageous to use refractory metals such as Mo, W, Ti, Zr, Hf, Nb and Ta for this purpose.

In comparison with the conventional electrode wiring materials, these metals exhibit lower specific resistance and higher corrosion resistivity at a high temperature. Thus when silicides of these metals are used for electrode wiring of semiconductor devices, high-speed operation of the semiconductor devices is made possible, and corrosion due to various agents at the time of production, or oxidation at the time of high temperature treatment can be substantially prevented.

By controlling three principal features, such as grain size of the material powder, heating temperature, and press-pressure, a mixed structure of the sputtering target of this invention containing 400 to $400 \times 10^4$ $MSi_2$ phase grains per one $mm^2$ of the structure, and grain diameter thereof falling in a range of 0.5 to 30 μm can obtained. The average grain diameter of the MSi, phase becomes 2 to 15 μm, while the average gain diameter of the Si phase becomes 2 to 10 μm.

During the silicide synthesizing time, B, P, sb, As contained in Si material as well as the elements such as Fe, Ni, Cr, Al and the like, and constituting unavoidable elements, are dispersed to be moved into an interface region between the $MSi_2$ phase and the Si phase so as to produce an interface layer that intensifys the conbining strength between the two phases.

This invention has been completed based on the above described knowledges.

The invention will now be described in more detail.

When a mixed powder of M and Si is heated under an appropriate pressure, the Si is softened while it is reacted with M to form $MSi_2$ of granular shape. Thus, at a portion where M is held in contact with Si, the temperature is locally brought up by the reaction heat of $MSi_2$, so as to further soften Si. As a consequence, grains partly formed into $MSi_2$ are coagulated around each $MSi_2$ grain, and thus coagulated $MSi_2$ grains are coupled with each other as to provide a link-coupled structure. When the $MSi_2$ grains are separately distributed in Si phase, the Si phase having a larger sputter rate is eroded firstly in accordance with the progress of sputter, so that $MSi_2$ phase tends to be dropped out easily. For this reason, it is preferable that MSi, phase grains are coupled together in an interlinked manner.

Further, when the grain diameter of $MSi_2$ phase exceeds 30 μm, projecting portions are formed during sputtering on the $MSi_2$ grain, thus creating particles. On the other hand, when the grain diameter of MSi phase is less than 0.5 μm, the $MSi_2$ phase easily drops out during sputtering to create particles. As a consequence, it is preferable that the grain diameter of $MSi_2$ phase is held in a range of from 0.5 to 30 μm, more preferably in a range of from 2 to 20 μm.

In a case where the x value in a composition $MSi_x$ is in a range of from 2.0 to 4.0, and the grain diameter of $MSi_2$ is in a range of from 0.5 to 30 μm, it is also preferable that $MSi_2$ of 400 to $400 \times 10^4$ grains are provided in each $mm^2$ of the mixed structure. In a case where the grain diameter of $MSi_2$ is in the range of 2 to 20 μm, it is preferable that $MSi_2$ of 2,000 to 300,000 grains are provided in each $mm^2$ of the mixed structure.

Further, the size of $MSi_2$ depends on the grain diameter of the metal grain forming the metal silicide. However, most of the M grains are in a coagulated state so that $MSi_2$ of different grain diameters are produced. According to increase of variation range of the grain diameter, projection and recess of the eroded surface due to sputtering become significant, and because of the effect of the difference in surface level, the generated amount of particles increases. For this reason, it is required to equalize the grain diameter as far as possible, and it is desirous that average grain diameter of $MSi_2$ phase is in a range of from 2 to 15 μm, preferably in a range of 5 to 10 μm.

Herein described average gain diameter is an average diameter of every 100 grains of the metal silicide.

As for the shape of $MSi_2$ grains coupled in a linked manner, nearly spherical configuration is most desirous. The reason of this resides in that the spherical grain hardly drops out of the mixed structure formed with the Si phase, and angular grain easily generates particles because of abnormal discharge. From this view-point, since metal grains obtained by ion-exchange refining method are easily coagulated during a reduction process, and $MSi_2$ grains obtained by combining these M grains exhibit much projection and recess, it is required that the coagulation is suppressed by a treatment under a reduction condition hardly causing coagulation, or by adding a dispersing agent at the time of mixing powders. Otherwise, it is also preferable that the M gains produced by a Chemical Vapor Deposition method, and hence having a good grain dispersing property are used for obtaining $MSi_2$ phase.

The Chemical Vapor Deposition method (hereinafter termed CVD method) is a method wherein a material such as halide, sulfide, hydride and the like is made into vapor phase at a high temperature, subjected to a chemical reaction such as thermal decomposition, oxidation or reduction, and thus obtained reaction product is deposited on a substrate. This method is widely used for producing semiconductors and insulation films.

On the other hand, Si reacts with M grains to form $MSi_2$ with excessive Si forcibly flowing around $MSi_2$ grains, so as to obtain a configuration having Si distributed discontinuously in the gaps formed between $MSi_2$ grains combined in a link form.

Continuous distribution of Si invites collapse of grains due to the fact that Si is eroded in preference to $MSi_2$ according to the progress of sputtering, and because of reduction of mechanical strength owing to the thermal stresses created in the target during sputtering Si portions susceptible to thermal shock tend to be broken down. For preventing generation of particles by improving mechanical strength, it is advantageous that Si is distributed discontinuously in the gaps of $MSi_2$.

Further, when the grain diameter of Si exceeds 30 μm, ollapse of the eroded Si portion tends to occur due to the thermal effects. In addition, projecting portions formed in the Si phase during sputtering tends to generate particles, and therefore the maximum grain diameter of Si is selected less than 30 μm, preferably less than 20 μm.

When the deviation in grain diameter of Si becomes large, the stress occurs concentratedly in a part where grain diameter is large, so that the part is easily broken by repetition of the thermal stress. For this reason, the average grain diameter of Si is selected preferably in a range of from 2 to 10 μm, and more preferably in a range of 3 to 8 μm.

Herein, grain diameter of Si is an average value between the maximum measurement and the minimum measurement of Si phase provided in the gaps of $MSi_2$ while the average grain diameter of Si is an average value of grain diameters of 100 grains.

It is desirous that a raw material Si powder of high purity or of high purity containing a doping agent is used for the production of the target. It is desirous to lower the content of the impurities contained in the high-purity Si powder as low as possible, because the impurities deteriorate the characteristics of semiconductor element. For example, a content of radio-active element such as U, Th causing a soft-error is restricted less than 5 ppb. The content of alkaline metal element such as Na, K causing movable-ion contamination is restricted less than 100 ppb. Impurities mixed in the high-purity Si must be heavy metal elements, such as Fe, Ni, Cr and else. constituting deep-level impurities, are restricted less than 1 ppm, carbon causing particle generation and etching defect is restricted less than 300 ppm, and oxygen causing resistance increase is restricted less than 500 ppm.

The impurities such as carbon, oxygen, Na, K and else, contained in the Si powder have been adhered to the powder surface during Si crashing steps, and reduction of these impurities can be attempted by subjecting the impurity-contaminated Si powder to a heating process of from 1200° to 1300° C. under a vacuum lower than $10^{-4}$ Torr for 2 to 6 hours. It is desirous that a material Si power thus heat processed is used for the production of the target.

Ordinarily, when a target is formed out of a material Si powder containing a doping agent, this doping agent tends to be dispersed and condensed at the reaction and synthesis time to specific areas in the interface of crystals. The doping agent thus dispersed causes disturbance in crystal grating, and moves to boundries between the $MSi_2$ phase and Si phase to form an interface layer.

By the existence of the interface layer, the bonding strength between the $MSi_2$ phase and Si phase increases, and the $MSi_2$ phase is made difficult to drop-cut from the mixed structure of the $MSi_2$ phase and the Si phase. Further the existence of the interface layer of high doping agent density in the boundary between the $MSi_2$ phase of low electric resistance and the Si phase of high electric resistance eliminates abrupt variation of the resistance, so that abnormal discharge at the time of sputtering is reduced, and generation of the particles caused by abnormal discharge can be suppressed.

As a result of further study for realizing smooth variation of electric resistance in the boundary between $MSi_2$ phase and Si phase, it is found that where a target is produced from Si powder and M powder, or from $MSi_2$ powder, containing at least one kind of element selected from B, P, Sb and As, as a doping agent, and also containing an unavoidable element, and electric resistance of the powders is controlled, the target thus produced exhibits an improved alignment in the electric resistance of the $MSi_2$ phase and the Si phase, and the sputtering speed therefrom is also made uniform. Since an interface layer, in which the above described element is diffused, is formed between the $MSi_2$ phase and the Si phase, no abrupt variation of electric resistance occurs, and a target having an excellent interface strength is thereby obtained.

Among the above described doping agents, B, P, Sb and As are elements capable of decreasing electric resistance widely, and when an Si phase containing these elements is used, electric resistances of both phases are sufficiently aligned, rendering the sputtering speed to be uniform, and providing a thin film of stable composition and uniform thickness. At the time of sintering, these elements contained in Si phase are diffused to move into the interface region between the $MSi_2$ phase having disturbance or deformation of crystal grating and the phase so as to form an interface layer. At this time, elements such as Fe, Ni unavoidably contained beside of B, P, Sb and As also impart similar effects.

As for the thickness of the interface layer, although it is different by the amount of doping agent contained in the Si phase, a value in a range of from 100 to 10,000 Å is considered to be appropriate.

In a case where the thickness of the interface layer is larger than 10,000 Å, the characteristics of the thin film tend to be varied, while in a case where the thickness of the interface layer is less than 100 Å, the above described advantageous effects cannot be expected sufficiently. More preferable range of the thickness is from 1,000 to 8,000 Å.

The thickness of the interface layer can be detected by a high resolution secondary ion mass spectroscope (SIMS).

The SIMS executes sputter etching of a specimen by use of $O^{2+}$ or first order ion of $Cs^+$, and seizes the secondorder ions thereby generated for analyzing impurities in the surface layer in a 3rd-order manner at a high sensitivity. The thickness of the interface layer is measured by measuring the profile in the depthwise direction of doping agent contained in the Si phase until it reaches the $MSi_2$ phase.

Herein, the thickness of the interface layer is defined to be a distance from an inflection point located in an entailed portion of the profile of the doping agent in the Si phase to another inflection point.

The aforementioned electric resistivity of Si phase is preferably selected in a range of from 0.01 to 100 Ω. cm.

When the resistivity is selected less than 0.01 Ω. cm, the sputtering speed of Si phase increases, and thereby deeply eroded Si not only invites generation of the particles, but also makes it impossible to obtain a desired film structure. On the other hand, when the resistivity exceeds 100 Ω. cm, the above described effects cannot be expected. More preferably, the resistivity of Si phase is selected in a range of from 0.1 to 10 Ω. cm.

On the other hand, portions contaminated by carbon are not sputtered sufficiently, but remain on the eroded surface in a projecting manner. As a result, plasma-discharge in these portions becomes unstable, repeating abnormal discharge in these portions, and inducing generation of particles. When a large amount of carbon is mixed in the thin film, etchaning tends to remain in the part at a time when wirings are formed in the part by etching, resulting disconnections due to faulty wiring and existence of insulating substances. For this reason, it is required that the contents of carbon impurity is restricted less than 100 ppm, preferably less than 50 ppm, more preferably less than 30 ppm. The carbon contents is detected by a carbon detector by use of combustion-infrared ray absorbing method.

In a case where a large amount of oxygen impurity is contained in the target, the oxygen tends to be mixed in the thin film at the sputtering time, and increases electric resistance of the thin film. For this reason, the oxygen contents is suppressed preferably less than 150 ppm, more preferably less than 100 ppm. The oxygen contents is detected by an oxygen analyzer by use of an inert gas melting-infrared ray absorbing method.

The sputtering target of this invention is formed into a mixed structure of a minute granular $MSi_2$ phase and Si phase. This structure is obtained such that a mixed powder formed out of M powder and Si powder is subjected to a sinter-synthesizing process so as to provide the $MSi_2$ phase, and in this case, the mixing ratio of these powders is selected to provide a composition of $MSi_x$ wherein X value is held in 2.0<X<4.0. That is, excessive Si remains so as to stick around the $MSi_2$ phase.

When the mixed powder of M and Si is heated under an appropriate pressure, Si is softened while it reacts with M to provide $MSi_2$. At portions where Si grains are held in contact with M grains, the temperature of the mixture locally rises up by the reaction heat so that Si is further softened. As a result, Si grains are coagulated around the surface of grains now being formed into $MSi_2$ composition so as to promote the combining reaction. On the other hand, $MSi_2$ phase and Si phase, or $MSi_2$ phase grains themselves are rigidly coupled together by a diffusion reaction, so that a large amount of not-yet reacted Si is somewhat softened and the excessive amount of Si is forcibly moved around the $MSi_2$-forming grains so as to tighten the structure.

The reason why the X value in the composition $MSi_x$ is restricted to 2.0<X<4.0 is as follows. In a case where the X value in the composition $MSi_x$ is made less than 2.0, a large tensile force is created in the silicide film thus formed, thus deteriorating bonding nature between the film and the substrate and facilitating peeling-off from the substrate. Conversely, when the X value of the composition exceeds 4.0, the sheet resistance of thin film becomes high, thus making it improper to be used as electrode wiring thin film.

Further, there is a relation between the density ratio of the target and generating amount of particles, and in a case of low density, plenty of pores are provided the target, abnormal discharge tending to occur in the portions, and the part thereby collapsed causing generation of the particles. For this reason, it is desirous that the density ratio of the entire portions of the target is held to be higher than 99%. Herein the density ratio (d=dt/ds) is a ratio between a theoretical density (ds) calculated from the component ratio of the sintered substance and the density (dt) of the sintered substance practically measured by Arehimedes's method.

Further, the inventors of this invention found out that the separation of particles from the target during sputtering not only depends upon surface defective layers created in the $MSi_2$ phase and Si phase, but also is caused by work defect layers, surface condition, or remaining stresses created at the time when the silicide sintered substance is subjected to machining such as grainding and finishing. That is, the grainding and finishing of target have been heretofore carried out such that the work is scraped and ground by hard grains of a grinder rotated at a high speed. In a case where a rigid and brittle material such as the silicide sintered substance consisting of a metal silicide and silicon is worked by a method as described above, it is inevitable that granular chips are separated from the surface of the work. According to the knowledge of the inventions, it is considered that the reason resides in that at the time of grainding, minute cracks are created on the surface of work by a stress caused by contact of the work with hard abrasive grains and after the abrasive grains have passed, edge portions of the cracks are pushed up by abrupt release of the stress and separated in the form of fragment pieces. Ordinarily at the time of working a brittle material, cutting depth or cutting load per each abrasive grain is made suitably large, so that cracks are extended in a local stress field formed by the grains, and by accumulating the minute collapse of the material, the working of the material is progressed. Accordingly, on the worked surface of the silicide sintered substance, a large number of work-defective layers such as grinding traces, dropped-out holes, and minute cracks are created.

When sputtering is executed by use of the target having these defective layers on the entire surface thereof, minute grains are stripped off and dropped out of the surface of the target by the impact of ions provided in plasma, with the above described defect portions taken as starting point, thus generating the particles. For this reason, it is desirous to finish the surface of the target such that the surface roughness Ra (center line roughness is maintained less than 0.05 μm, and the work defective layers such as minute cracks and defective portions caused by the machining are not remained substantially.

Herein, as is defined in Japan Industries Standard (JIS-B0601), when a portion of a roughness curve having a measured length l in the direction of the center line is extracted, the X axis is set to the center line of the extracted portion, the Y axis is set to the direction of the longitudinal magnification, and the roughness curve is expressed by y=f(x), the surface roughness Ra defined in micrometer (μm) is calculated as follows.

$$Ra = \frac{1}{l} \int_0^l |f(x)| dx$$

To reduce the finished surface rougness and to substantially remove any artwork defective layers in which cracks and coming-off holes are formed, it is important to reduce the working unit relative to the distribution of material defects. More specifically, it is necessary to use abrasive grains having a smaller and uniform grain size or to reduce the load per abrasive grain by using a material such as a soft polisher improved in elasticity or viscoelasticity to limit the stress caused in the material to a value lower than the breaking stress.

Accordingly, even in the case of a brittle material such as a sintered substance including a metal silicide, when the afore-mentioned load is extremely small, the material exhibits only plastic deformation thus providing no crack-forming region, so that it is made possible to obtain finished surface having least amount of projection and recess and bright. As a practical method, lapping and polishing methods for finishing the surface, and a mechano-chemical polishing method for finishing the surface with extremely high precision are considered preferable.

The mechano-chemical polishing is a method wherein a conventional mechanical method utilizing a grinding stone, and a convevtional chemical method utilizing chemical effects of eroding the polished material surface by a chemical agent, are used in combination.

However, practically it is difficult to finish a silicide sintered substance to a desired size by use of these methods only, and therefore it is required that the surface is firstly worked by a more efficient method such as grinding, and then finished by the combined use of lapping and polishing steps.

In the above described surface working method, since the abrasive grain size is reduced according to the order of lapping, polishing, and mechano-chemical polishing, roughness of the finished surface is also minimized in this order. By applying such a working method to the metal silicide target, the amount of particles generated from the target is substantially reduced. According to the knowledge of the inventors there is a corelation between the generated amount of the particles and the roughness of the surface. In order to suppress generation of particles, it is desired that the surface roughness Ra (center-line roughness) of the worked surface is less than 0.02 µm, preferably less than 0.05 µm.

In the sputtering caused by Ar ion irradiation, the ion impacting point becomes a high-stress field and is exposed to high temperature. Accordingly, when residual stress remains unevenly in the target surface layer portion, the stress is redistributed by the heat created during sputtering, thus locally increasing the stress. As a result, large cracks including radial cracks are created, and the amount of the separated particles is considerably increased. Accordingly, it is preferable that the residual stress is reduced less than 15 kg/mm$^2$, more preferably less than 5 kg/mm$^2$.

The manufacturing method of this invention will now be described in more detail. The method comprises a step 1 where M powder and Si powder are mixed with each other at a predetermined ratio; a step II where the mixed powder is heated at a low temperature for reducing the carbon and oxygen contents; a step III where the M/Si mixed powder is filled in a mold, and subjected to a silicide reaction under a low hot-press pressure and a high vacuum, for executing synthesis of a refractory metal silicide; and a step IV where the thus synthesized metal silicide is sintered under a high hot-press pressure so as to obtain a compact and tight structure. The temperature and press-pressure used in the steps III and IV constitute very important factors for obtaining a sintered substance of high density and compact structure.

The step I of the manufacturing method is a step for preparing and mixing M power and Si power so as to obtain a mixed composition at an Si/M atom ratio of 2.0 to 4.0. In this step of mixing M powder and Si powder, the grain sizes of the two kind of powders impart significant effect to the grain sizes of thus synthesized MSi$_2$ and Si interposed in the MSi$_2$ grains. In order to provide the afore-mentioned minute structure, it is preferable to use M powder of a maximum grain size less than 10 µm and Si powder of maximum grain size less than 30 µm.

The reason why the X value of the composition MSi$_x$ is restricted to 2.0<X<4.0 resides in that when the X value is less than 2.0, a large tensile stress is created in the thus formed silicide thin film, so that the bonding nature of the thin film to the substrate is deteriorated, thus tending to be peeled off from the substrate. On the other hand, when the X value exceeds 4.0, the sheet resistance of the thin film becomes high, and it becomes unsuitable to be used for providing electrodes and wirings. According to this step, the raw material M powder and Si powder are mixed together at an Si/M atom ratio of from 2.0 to 4.0 by use of a ball mill or a V-shape mixer of dry type so that a mixture of sufficiently uniform structure is thereby obtained. Uneven mixture is not advantageous because the composition and structure of the resultant target become uneven, and the property of a thin film thereby formed is deteriorated.

Herein, in order to prevent oxygen contamination, it is desirous that the mixing operation is carried out in vacuum or in an atmosphere of inert gas.

Further, in consideration of a volatile loss of Si and SiO, from the surface of the Si powder at a time when the powder is heated to a high temperature, it is proper that an amount of the Si powder somewhat larger than its objective value is mixed with the other powder. The excessive amount is selected less than 5% based on experience and in consideration of the temperature, period and pressure and the like of the subsequent step.

In the step II, the mixed powder prepared by the step I, is heated at a low temperature and high vacuum so as to reduce carbon and oxygen contents. In this step, it is important that the heating temperature, holding time and the degree of vacuum are set to appropriate values in a state where no press-pressure is applied. More specifically it is desirous to set the heating temperature in a range of from 1,000° to 1,300° C. At a temperature lower than 1,000° C., removal of impurities is not sufficient, while a temperature higher than 1,300° C., silicide reaction starts, and the evaporation of impurities becomes insufficient, thus providing a target containing large amount of carbon and oxygen. More preferably, the heating temperature is selected in a range of from 1,100° C. to 1,300° C.

It is advantageous that the holding time is set in a range of from 1 to 10 hr in consideration of the heating temperature. When the holding time is less than 1 hr, the above described advantage cannot be obtained sufficiently, and when the holding time is longer than 10 hrs, the productivity is reduced. On the other hand, in order to reduce carbon and oxygen sufficiently, the vacuum within the hot-press is preferably set to a high vacuum less than 10$^{-4}$ Torr, and more preferably less than 10$^{-5}$ Torr. However, when the degree of vacuum in the hot-press is abruptly increased, the mixed powder tends to flow-away out of the mold, so that the tightness of the sintered substance becomes insufficient even after the execution of the subsequent step. Accordingly, it is desirous that the degree of vacuum in the hot-press is increased gradually until it becomes a value less than 100 Torr.

In the step III, degassed mixed powder is heated under a high vacuum and low press-pressure to synthesize $MSi_2$ phase. In this silicide synthesis step, it is required that the heating temperature and the press-pressure are set to appropriate conditions, silicide reaction is caused to progress gradually, grow of $MSi_2$ grains is suppressed, and softened Si is caused to flow in gaps between $MSi_2$ grains. For this, it is desirous to set the heating temperature in a range from 1,000° to 1,300° C. In a case where heating temperature is less than 1,000° C., silicide reaction is not easily started, and in a case where it exceeds 1300° C. $MSi_2$ grains grow by a rapid silicide reaction such that the grains become coarse and large. Accordingly, it is desirous that the heating temperature is set preferably in a range of from 1,100° C. to 1,300° C.

At this time, the heating speed is desired to be set to less than 20° C./minute for obtaining synthesized $MSi_2$ phase of a minute structure. In order to realize good controllability of the silicide reaction speed, and to prevent absorption of impurity gas, it is desired that the reaction is effectuated in an atmosphere of high vacuum less than $10^{-4}$ Torr.

Further, since the press-pressure affects much upon the grain diameter of the $MSi_2$ grains, it is desirous to set the pressure in a range of from 10 to 100 kg/cm$^2$. When the press-pressure is less than 10 kg/cm$^2$, silicide reaction heat becomes low, and softening and flow of Si is not sufficient, thus entailing a defective structure of uneven Si separation. On the other hand, when the press-pressure is larger than 100 kg/cm$^2$, contacting pressure between M powder and Si powder becomes large, silicide reaction heat increases to accelerate reaction, and $MSi_2$ grain size becomes large and coarse. The press-pressure is more preferably set in a range of from 30 to 60 kg/cm$^2$.

As for the atmosphere at the time of silicide synthesis, a high vacuum less than $10^{-4}$ Torr is preferable as described before in consideration of the silicide reaction speed and absorption of impurity gas.

Step IV is a step wherein the sintered substance is heated in high vacuum or in an atmosphere of inert gas, under a high press-pressure, and at a temperature just below the entectic point so as to obtain a minute and compact structure of the sintered substance.

In this step of obtaining compactness of the sintered substance, press-pressure, heating temperature, and heating time at this temperature are important for obtaining the compact structure.

The press-pressure used in this step is preferably held in a range of 100 to 300 kg/cm$^2$ for promoting compactness of the sintered substance. When the press-pressure is lower than 100 kg/cm$^2$, the density of the resultant sintered substance becomes low containing a large number of pores remained in the substance, while in the case where the press-pressure exceeds 300 kg/cm$^2$, although the density of the sintered substance becomes high, the mold made of graphite tends to be broken. Accordingly a range of from 150 to 250 kg/cm$^2$ is more preferably desired.

As for the sintering temperature (heating temperature) T of this step, a temperature just below the eutectic point; that is, a range $Ts-50 \leq T < Ts$ is preferable. Herein, eutectic temperatures Ts of W, Mo, Ti and Ta constituting the metal M are 1,400°, 1,410°, 1,330° and 1,385° C., respectively. When T is lower than Ts–50, pores remain, so that it is difficult to obtain a high density sintered substance. On the other hand, when T is higher than Ts, Si phase melts to flow out of the mold, thus obtaining a sintered product having a large deviation in the component ratio.

Further, the holding time of the heating temperature of the heat sintering is preferably selected in a range of from 1 to 8 hrs. When it is shorter than 1 hr, much pores remain, so that a sintered substance of high density cannot be obtained, while when it is longer than 8 hrs, the density of sintered substance is not increased anymore so that the efficiency of manufacturing target is reduced. It is desirous that the densifying sinter is executed in vacuum or in the atmosphere of inert gas for preventing contamination caused by mixing of impurities. Nitrogen atmosphere is not advantageous because it tends to produce $Si_3N_4$.

BRIEF DESCRIPTION OF THE DRAWINGS

FIG. 1A is a scanning type electron microscope photograph of a metallic structure of a target according to preferred embodiments of this invention;

FIG. 1B is a partial schematic drawing to be used for explaining the metallic structure shown in FIG. 1A:

FIG. 2A is a scanning type electron microscope photograph showing a metallic structure of a target according to reference and conventional examples;

FIG. 2B is a partial schematic drawing to be used for explaining the metallic structure shown in FIG. 2A;

FIG. 3A is a scanning type electron microscope photograph showing an eroded surface configuration of the target according to the preferred embodiments;

FIG. 3B is a partial schematic drawing to be used for explaining the surface configuration shown in FIG. 3A;

FIG. 4A is a scanning type electron microscope photograph showing an eroded surface configuration of a target according to the reference and conventional examples;

FIG. 4B is a partial schematic drawing to be used for explaining the surface configuration photograph of FIG. 4A;

FIG. 7A is a metallic structure photograph of a target of the embodiments of this invention obtained by an optical microscope;

FIG. 7B is a partial schematic drawing to be used for explaining the metallic structure photograph of FIG. 7A;

FIG. 8A is a metallic structure photograph of a target according to reference examples obtained by an optical microscope;

FIG. 8B is a partial schematic drawing to be used for explaining the metallic structure photograph shown in FIG. 8A;

FIG. 9A is a metallic structure photograph of a target according to conventional examples obtained by an optical microscope;

FIG. 9B is a partial schematic drawing to be used for explaining the metallic structure photograph shown in FIG. 9A;

FIG. 10A is a scanning type electron microscope photograph showing an eroded surface of a target according to the embodiments of this invention;

FIG. 10B is a partial schematic drawing to be used for explaining the eroded surface photograph shown in FIG. 10A;

EMBODIMENTS OF THE INVENTION

Figure 5A:
FIG. 5A is a scanning type electron microscope photograph showing, in much enlarged manner, a projecting portion formed on the eroded surface of the target according to the reference and conventional examples.

The construction and effects of the present invention will now be described in detail with respect to the following embodiments.

EMBODIMENTS 1 TO 12

As shown in Table 1, a high purity metal powder made of W, Mo, Ta or Nb and having a maximum grain diameter less than 10 μm was mixed with a high purity Si powder having a maximum grain diameter less than 30 μm at a Si/M atom ratio of 2.7, and the resultant mixed powder was further subjected to mixing treatment in a ball mill replaced with a high purity Ar gas for 48 hrs. Thus treated mixed powder was filled in a mold, provided in a hot-press, and degassed in vacuum of $8\times10^{-5}$ Torr, at a temperature of 1,200° C. for 3 hrs so as to reduce impurities of carbon, oxygen and the like.

Then silicide synthesizing and compactness providing sinter was executed under a condition shown in Table 1, and this obtained sintered body was then ground and finished with electric discharge to obtain a target of a diameter 260 mm and a thickness 6 mm.

REFERENCE EXAMPLES 1 TO 12

As a reference example, a high purity metal powder made of W, Mo, Ta or Nb and having a maximum grain diameter less than 100 μm was mixed with a high purity Si powder having a maximum grain diameter less than 200 μm at a Si/M atom ratio of 2.7, and the resultant mixed powder was, without being heat-treated for degassing under a high vacuum, subjected to a silicide synthesizing and tightness-providing sintering process under a condition as shown in the Table 1. The resultant sintered body was then made into a target of a diameter 260 mm and a thickness 6 mm by grinding and discharge finishing the same.

CONVENTIONAL EXAMPLES 1 TO 3

A mixed power was prepared by mixing a high purity metal .powder made of W, Mo, Ta or Nb and having a maximum grain diameter less than 100 μm, with a high purity Si powder having a maximum grain diameter less than 200 μm at a Si/M atom ratio of 2.0. Thus prepared mixed powder was then heated under a vacuum of $2\times10^{-4}$ Torr and at a temperature of 1,300° C. for 4 hrs to obtain a semi-sintered substance, and thereafter it was impregnated with melted Si so as to provide a sintered substance of Si/M atom ratio 2.7. The sintered substance was then made into a target of the conventional examle 1 having a diameter 260 mm and a thickness 6 mm by grinding and discharge finishing the same.

A mixed powder was prepared by mixing a high purity metal power made of W having a maximum grain diameter less than 15 μm with a high purity Si powder having a maximum grain diameter less than 20 μm at Si/M atom ratio of 2.7. Thus prepared mixed powder was then heated under a vacuum of $8\times10^{-5}$ Torr and at a temperature of 1,250° C. for 4 hrs to obtain a semi-sintered substance. The semi-sintered substance is then filled in a pressure-tight sealed can, and then subjected to a hot isostatic pressing under a pressure of 1,000 atom to provide a sintered body. Thus obtained sintered body is ground, polished and discharge-finished to provide a target of a diameter 260 mm and a thickness 6 mm constituting a conventional example 2.

A mixed powder was prepared by mixing a high purity W powder having a maximum grain diameter less than 100 μm with a high purity Si powder having a maximum grain diameter less than 200 μm at Si/M atom ratio of 2.5. Thus prepared mixed powder was then heated under a vacuum of 2. $10^{-4}$ Torr and at a temperature of 1,300° C. for 4 hrs to obtain a semi-sintered substance. The semi-sintered substance was then crashed, and added with silicide synthesized powder so as to obtain a Si/M atom ratio of 2.7. The resultant substance was then subjected to hot-press in an Ar gas atmosphere under a condition of 1,380° C.×3 hrs to obtain a sintered body. The sintered body was then grind polished and discharge finished to obtain a conventional example 3 target having a diameter of 260 mm and a thickness of 6 mm.

Microscope observation results of the structure of a sectional surface of the embodiment target and the reference example target are shown in FIGS. 1A and 1B and FIGS. 2A and 2B. As shown in FIGS. 2A and 2B, the structure of the target according to the reference example exhibited uneven separation of $Si_2$ and coarse $MSi_2$ 1, while the target of the embodiment shown in FIGS. 1A and 1B exhibited a minute and uniform structure wherein $MSi_2$ 1 of maximum grain diameter less than 10 μm was connected in a link form, and $Si_2$ was distributed in the gaps of the $MSi_2$ 1 discontinuously. Further, as a result of analyzing the contents of carbon and oxygen, it was found that in the target of the embodiment, the contents of carbon and oxygen were less than 50 ppm and 100 ppm, respectively, while in the target of the reference example, the contents thereof were approximately 250 ppm and 1,500 ppm, respectively.

In the Table 1, there are also indicated the results of the case where the targets obtained in accordance with embodiments 1 to 12, reference examples 1 to 12 and conventional examples 1 to 3 were set in a magnetron sputtering apparatus, sputtering then executed under an argon-gas pressure of $2.3\times10^{-3}$ Torr so that a silicide thin film of approximately 3,000 Å was formed on a five inch Si wafer, and a mixed amount of particles was then measured.

TABLE 1

| No | M powder | Average grain diameter MSi$_2$ (μm) | Si (μm) | Silicide synthesizing condition Temperature × time (°C. × hr) | Pressure (kg/cm$^2$) | Sintering condition for tightening Temperature × time (°C. × hr) | Pressure (kg/cm$^2$) | Carbon content (ppm) | Oxygen content (ppm) | Density ratio (%) | Amount of particles (No.) |
|---|---|---|---|---|---|---|---|---|---|---|---|
| Embodiments Examples | | | | | | | | | | | |
| 1 | W | 7 | 8 | 1100×5 | 60 | 1400 × 5 | 250 | 25 | 34 | 99.4 | 14 |
| 2 | W | 5 | 7 | 1150×4 | 50 | 1400 × 4 | 250 | 46 | 85 | 99.5 | 22 |
| 3 | W | 5 | 5 | 1200×3 | 30 | 1390 × 4 | 250 | 87 | 145 | 99.8 | 35 |
| 4 | Mo | 8 | 7 | 1100×5 | 60 | 1400 × 5 | 250 | 21 | 27 | 99.3 | 13 |
| 5 | Mo | 8 | 6 | 1150×4 | 40 | 1400 × 4 | 250 | 40 | 76 | 99.6 | 26 |
| 6 | Mo | 6 | 6 | 1150×4 | 30 | 1390 × 4 | 250 | 90 | 124 | 99.7 | 38 |
| 7 | Ta | 7 | 9 | 1150×4 | 65 | 1370 × 5 | 250 | 22 | 42 | 99.4 | 13 |
| 8 | Ta | 7 | 8 | 1150×4 | 45 | 1360 × 4 | 250 | 34 | 92 | 99.6 | 24 |
| 9 | Ta | 5 | 6 | 1200×3 | 35 | 1360 × 4 | 250 | 78 | 147 | 99.5 | 37 |
| 10 | Nb | 8 | 7 | 1100×5 | 60 | 1370 × 5 | 250 | 26 | 28 | 99.4 | 21 |
| 11 | Nb | 6 | 6 | 1150×4 | 40 | 1360 × 4 | 250 | 43 | 77 | 99.7 | 28 |
| 12 | Nb | 6 | 6 | 1200×3 | 30 | 1360 × 4 | 250 | 88 | 132 | 99.6 | 39 |
| Reference Examples | | | | | | | | | | | |
| 1 | W | 30 | 60 | 1350×4 | 150 | 1370 × 4 | 250 | 139 | 1320 | 96.5 | 234 |
| 2 | W | 25 | 55 | " | " | " | " | 186 | 1470 | 97.3 | 321 |
| 3 | W | 20 | 47 | " | " | " | " | 235 | 1580 | 98.2 | 373 |
| 4 | Mo | 45 | 56 | 1350×4 | 200 | " | " | 127 | 1350 | 95.9 | 203 |
| 5 | Mo | 33 | 50 | " | " | " | " | 190 | 1440 | 96.7 | 311 |
| 6 | Mo | 23 | 45 | " | " | " | " | 236 | 1620 | 97.8 | 388 |
| 7 | Ta | 55 | 55 | 1350×4 | 180 | " | " | 145 | 1390 | 96.8 | 248 |
| 8 | Ta | 43 | 50 | " | " | " | " | 194 | 1470 | 97.7 | 331 |
| 9 | Ta | 32 | 43 | " | " | " | " | 247 | 1680 | 98.4 | 386 |
| 10 | Nb | 50 | 50 | 1350×4 | 250 | " | " | 147 | 1240 | 96.0 | 230 |
| 11 | Nb | 46 | 42 | " | " | " | " | 188 | 1460 | 97.7 | 328 |
| 12 | Nb | 30 | 40 | " | " | " | " | 246 | 1590 | 98.5 | 388 |
| Conventional Examples | | | | | | | | | | | |
| 1 | W | 56 | 45 | — | | — | | 20 | 25 | 98.3 | 245 |
| 2 | W | 12 | 22 | — | | — | | 147 | 180 | 99.3 | 84 |
| 3 | W | 25 | 23 | — | | — | | 260 | 1560 | 98.7 | 340 |

As is apparent from FIG. 1, the amount of particles generated from a target according to the embodiments of this invention was much smaller than that according to the reference examples and the conventional examples. Further when the eroded surfaces of the targets formed according to the embodiments, reference examples and the conventional examples were observed by use of a scanning type electron microscope (SEM), numerous projections 3 were found out on the eroded surfaces of the targets obtained by the reference examples and she conventional examples as shown in FIGS. 4A and 4B. However, as shown in FIGS. 3A and 3B, no projection was observed on the eroded surfaces of the targets obtained by the embodiments of the invention.

Figure 5B:
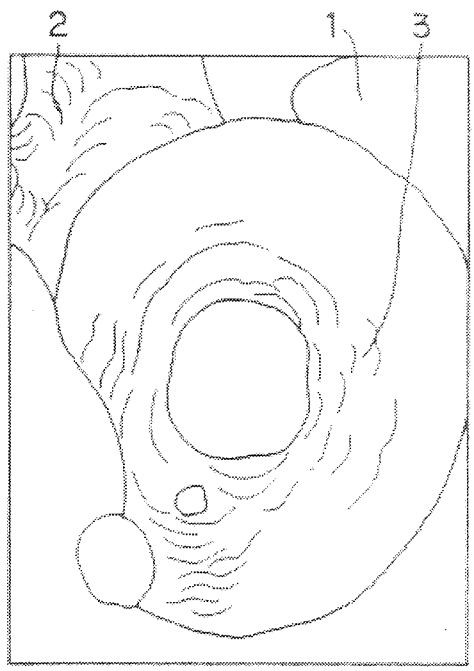
FIG. 5B is a partial schematic drawing to be used for explaining the projecting portion shown in FIG. 5A.
Figure 6:
FIG. 6 is a scanning type electron microscope photograph showing the results of element analysis of the surface of the projecting portion shown in FIG. 5A.
Figure 11A:
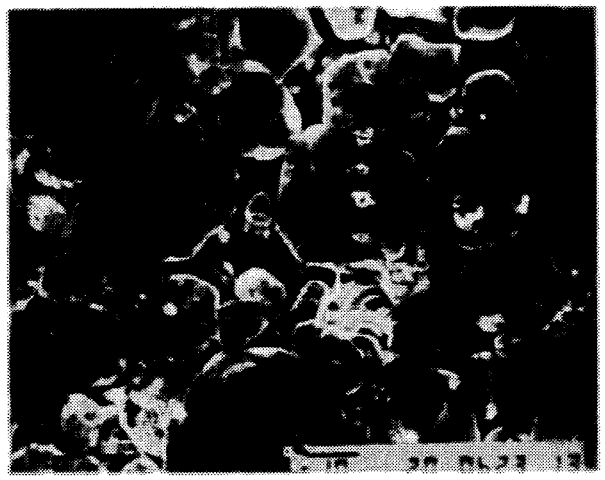
FIG. 11A is a scanning type electron microscope photograph of an eroded surface of a target according to reference examples.
Figure 11B:
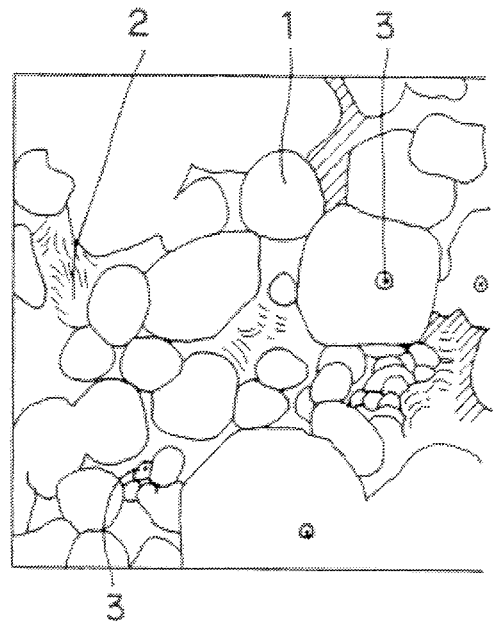
FIG. 11B is a partial schematic drawing to be used for explaining the eroded surface photograph shown FIG. 11A.
Figure 12A:
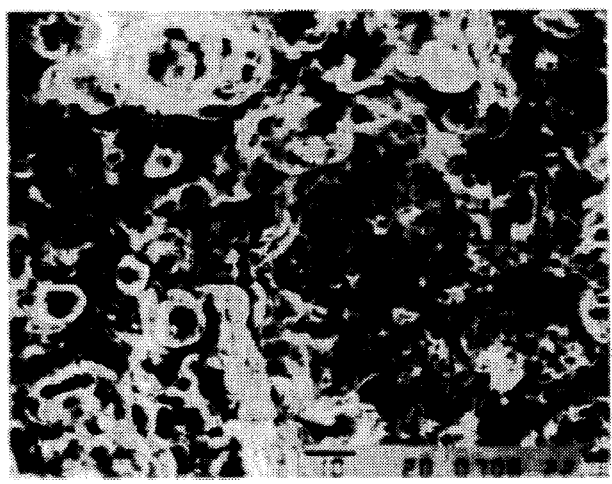
FIG. 12A is a scanning type electron microscope photograph showing an eroded surface of a target according to conventional examples.
Figure 12B:
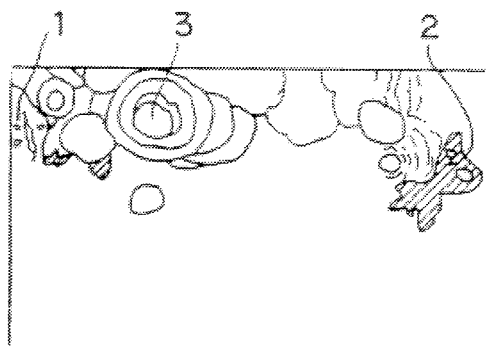
FIG. 12B is a partial schematic drawing to be used for explaining the eroded surface photograph of FIG. 12A.

A result of further magnified observation of a projection 3 having a comparatively large size found on the eroded surfaces of the targets according to the conventional and reference examples is indicated in FIGS. 5A and 5B, and a result of subjecting the surface of the projection 3 shown in FIG. 5A to an element-analysis by use of an X-ray microanalyzer (XMA) is shown in FIG. 6. As is apparent from FIG. 6, carbon dispersed in white dot manner on the surface of projection was observed, and this carbon constituted a reason for separating particles. It was confirmed that a target according to either of the embodiments of the invention contributed much to improve yield of the production when it was utilized to form electrode wiring of semiconductor devices.

Next, the property of the target will now be compared between a case where an interface layer is formed between the MSi$_2$ phase and the Si phase of the target (embodiments), and a case where no interface layer is formed (reference examples).

EMBODIMENTS 101 TO 104

A high purity metal powder made of W, Mo, Ti, Ta, Zr, Hf, Nb, V, Co, Cr or Ni, or a combination thereof and having an average grain diameter of 2 μm was mixed with a high purity Si powder (containing B, P, Sb, As and other unavoidable elements such as Fe, Ni and else) having an average grain diameter of 20 μm, at an Si/M atom ratio of 2.6, and the resultant mixed powder was thereafter subjected to a dry mixing process for 72 hrs in a ball mill, inside of which was replaced by high purity argon gas. Thus processed mixed powder was then filled in a hot-press mold made of high purity graphite. The entirety was then loaded in a vacuum hot-press and degassed under a vacuum of 5×10$^{-5}$ Torr and at a temperature of 1,250° C. for 2 hrs.

Then, in a vacuum of 5×10$^{-5}$ Torr and under application of 50 kg/cm$^2$ press-pressure, a metal silicide (MSi$_2$) was synthesized at 1,250° C. With high purity argon gas added as an internal atmosphere of the hot-press, and with the internal pressure raised to 600 Torr, the synthesized MSi$_2$ was sintered at 1,370° C. for 2 hrs. The resultant sintered body was then ground and discharge-finished to obtain a target of 260 mm diameter and 6 mm thickness.

REFERENCE EXAMPLES 101 TO 114

For obtaining a target of examples 101 to 110, a metal powder of high purity W, Mo, Ti, Ta, Zr, Hf, Nb, Co, Cr or Ni, having a 25 μm average grain diameter was mixed with a high purity Si powder of 40 μm average grain diameter at a Si/M atom ratio of 2.6, and then subjected to hot-press under following conditions:

hot-press temperature: 1,380° C.,
hot-press pressure: 250 kg/cm$^2$,
internal atmospheric pressure of
① 8×10$^{-5}$ Torr vacuum until 1,250° C.,
② 600 Torr argon gas in a range from 1,250° C. to 1,380° C., So that a target of a diameter 260 mm and a thickness 6 mm according to conventional method was obtained.

Further, for obtaining reference examples 111–114, a WSi$_2$, MoSi$_2$, TaSi$_2$ or TiSi$_2$ powder having an average grain diameter of 80 μm was mixed with a high purity Si powder having an average grain diameter of 60 μm, at an Si/M atom ratio of 2.6, and then subjected to hot-press under conditions similar to those of the reference examples 101 to 110, so as to obtain a target having a diameter 260 mm and a thickness 6 mm.

With respect to the targets obtained in the embodiments 101 to 114 and the reference examples 101 to 114, average thickness of the interface layers, density ratios, and flexing-strength were measured, and the results were indicated in Table 2. As is apparent from this Table, the targets according to the embodiments 101 to 114 exhibit high density and high flexion-strength, and that MSi$_2$ phase and Si phase are combined rigidly by the interface layer.

Further, sectional structures of the targets obtained by the embodiment, reference example and conventional example were observed by an optical microscope, and the observed results are indicated in FIGS. 7A, 7B, 8B and 9A, 9B, respectively. As is apparent from FIGS. 7A and 7B, in the case of the present embodiment, a minute mixed structure of the MSi$_2$ phase 1 and Si phase 2, having an average grain diameter of 10 μm, was observed. In the case of the target according to the reference example, the Si phase 2 and the MSi$_2$ phase 1 were both coarse and large as shown in FIGS. 8A and 8B, and in the case of the target according to the conventional example, it was confirmed that the S1 phase 2 and the MSi$_2$ phase 1 were both coarse, as shown in FIGS. 9A and 9B, and formed into a structure easily generating the particles.

The results of that the targets obtained according to the embodiments 110 to 114 and reference examples 101 to 114 were set in a magnetron sputtering apparatus, sputtering was executed under an argon gas pressure of 2.3×10$^{-3}$ so as to deposite a silicide thin film of 3,000 Å thickness on a 5 inch Si wafer, and then the amount of the particles contained in the thin film was measured, are also indicated in the Table 2.

TABLE 2

| | | Average grain diameter | | Si powder | | Target Average thickness of interface layer (Å) | Density ratio (%) | Flexion strength (kg/mm$^2$) | Carbon content (ppm) | Oxygen content (ppm) | Produced thin film Amount of particles (No.) |
|---|---|---|---|---|---|---|---|---|---|---|---|
| Example No. | M powder or MSi$_2$ powder | MSi$_2$ (μm) | Si (μm) | Doping agent | Electric resistance ratio (μΩ·cm) | | | | | | |
| Embodiments | | | | | | | | | | | |
| 101 | W | 6 | 7 | B | 200 | 1760 | 99.6 | 52 | 22 | 65 | 14 |
| 102 | Mo | 8 | 8 | P | 80 | 2200 | 99.8 | 50 | 28 | 73 | 12 |
| 103 | Ti | 7 | 6 | P | 300 | 1640 | 99.5 | 48 | 30 | 80 | 17 |
| 104 | Ta | 7 | 7 | Sb | 300 | 1550 | 99.7 | 46 | 27 | 77 | 19 |
| 105 | Zr | 8 | 8 | B | 80 | 3200 | 99.6 | 44 | 33 | 66 | 8 |
| 106 | Hf | 8 | 5 | As | 60 | 2720 | 99.5 | 42 | 20 | 72 | 11 |
| 107 | Nb | 5 | 7 | B | 500 | 1420 | 99.4 | 48 | 30 | 67 | 18 |
| 108 | V | 8 | 7 | P | 400 | 1670 | 99.5 | 45 | 23 | 57 | 14 |
| 109 | Co | 7 | 8 | P | 50 | 3180 | 99.8 | 47 | 20 | 68 | 10 |
| 110 | Cr | 7 | 6 | Sb | 100 | 2380 | 99.4 | 45 | 34 | 58 | 21 |
| 111 | Ni | 6 | 7 | B | 200 | 1860 | 99.5 | 50 | 26 | 71 | 16 |
| 112 | Mo + W | 8 | 6 | P | 800 | 1250 | 99.9 | 49 | 37 | 63 | 24 |
| 113 | Ta + Mo | 8 | 8 | P | 100 | 2210 | 99.6 | 50 | 29 | 75 | 17 |
| 114 | Nb + Zr | 8 | 8 | Sb | 500 | 1210 | 99.5 | 47 | 32 | 64 | 20 |
| Reference Examples | | | | | | | | | | | |
| 101 | W | 33 | 38 | — | 2.3 × 10$^{10}$ | — | 99.4 | 37 | 122 | 1270 | 146 |
| 102 | Mo | 28 | 32 | — | " | — | 99.1 | 35 | 109 | 1180 | 157 |
| 103 | Ti | 27 | 38 | — | " | — | 99.2 | 32 | 112 | 1230 | 150 |
| 104 | Ta | 25 | 34 | — | " | — | 99.3 | 35 | 133 | 1260 | 166 |
| 105 | Zr | 30 | 36 | — | " | — | 99.4 | 36 | 120 | 1130 | 147 |
| 106 | Hf | 33 | 32 | — | " | — | 99.2 | 34 | 130 | 1290 | 167 |
| 107 | Nb | 28 | 31 | — | " | — | 99.0 | 37 | 126 | 1210 | 177 |
| 108 | Co | 32 | 30 | — | " | — | 99.1 | 31 | 143 | 1250 | 184 |

TABLE 2-continued

| | | Average grain diameter | | Si powder | | Target | | | | | Produced thin film Amount of particles (No.) |
|---|---|---|---|---|---|---|---|---|---|---|---|
| Example No. | M powder or MSi₂ powder | MSi₂ (μm) | Si (μm) | Doping agent | Electric resistance ratio (μΩ·cm) | Average thickness of interface layer (Å) | Density ratio (%) | Flexion strength (kg/mm²) | Carbon content (ppm) | Oxygen content (ppm) | |
| 109 | Cr | 27 | 39 | — | " | — | 99.0 | 33 | 137 | 1200 | 173 |
| 110 | Ni | 29 | 32 | — | " | — | 99.2 | 35 | 140 | 1240 | 181 |
| 111 | WSi₂ | 82 | 53 | — | " | — | 96.5 | 30 | 180 | 1480 | 535 |
| 112 | MoSi₂ | 78 | 52 | — | " | — | 95.5 | 27 | 188 | 1570 | 505 |
| 113 | TaSi₂ | 80 | 50 | — | " | — | 92.2 | 25 | 175 | 1530 | 622 |
| 114 | NbSi₂ | 80 | 56 | — | " | — | 94.8 | 22 | 192 | 1450 | 536 |

As is apparent from the results shown in Table 2, the amount of the particles generated from the target of the embodiments was extremely small.

The sputtering surfaces of the targets obtained by the embodiments, reference examples, and conventional examples were observed by a scanning type electron microscope (SEM), and the metal structures as shown in FIGS. 10A, 10B, 11A, 11B, and 12A, 12B were found out. Although a large number of projections 3 were recognized on the sputtering surface of the reference examples (FIGS. 11A, 11B) and the conventional examples (FIGS. 12A, 12B), no projection 3 was observed on the surface of the target according to the embodiments as shown in FIGS. 10A, 10B. It was confirmed from these results that a substantial improvement could be expected in the yield of production by using the target of this invention for forming electrodes and wirings of semiconductor devices.

Next, the effects imparted to the generation of particles from the defective layer, surface condition and residual stress caused at a time when the sintered silicide substance is subjected to a mechanical finishing operation such as grinding for providing a target, will now be described with respect to the following embodiments.

EMBODIMENT 200

A sintered silicide substance (tungsten silicide) was cut by wire electrical discharge machining into a diameter of 260 mm, and thereafter the sintered substance was ground to have a thickness of 6 mm by employing a vertical-axis rotary surface grinder with a grinding wheel SD270J55BW6 under conditions: grinding wheel peripheral speed of 1,200 m/min; a table rotating speed of 12 rpm; and a grinding rate of 10 μm/min.

After the rearside surface of the target was soldered to a backing plate, the front side surface thereof was worked with a lens polisher and 15 μm diamond abrasive grains for 60 hrs, and then with 3 μm abrasive grains for 10 hrs. An ultrasonic cleaner was used to remove the working solution attached to the lapped surface, and the surface was thereafter degreased by acetone and dried out.

As a result of observing the worked surface by a scanning type electron microscope (SEM), no grinding streaks or dropped-out holes caused by grinding remained, and having no fine cracks caused by deformation breaking action of the abrasive grains were recognized, thus assuring removal of the work defect layers.

The roughness of the worked surface was observed with a surface roughness measuring apparatus (Talysurf and the residual stress in the worked surface was measured with an X-ray stress measuring apparatus on the basis of a parallel-inclination method. Table 3 shows the results of these measurements. The results of the corresponding measurements of a ground surface, held as it is, are also shown as reference example 200 in the Table 3.

After the target thus obtained was set in a magnetion sputtering apparatus, suputtering was executed Ar ion irradiation, so that a silicide thin film of 3,000 Å was deposited on a 5 inch Si wafer. The amount of particles contained in the thin film was measured.

The measured results are also indicated in Table 3. From the results shown in FIG. 3, it was confirmed that the amount of the particles was remarkably reduced by the target according to the embodiment 200, and that by the lapping operation, the amount of particles in the thin film produced by the target could be reduced widely.

EMBODIMENT 201

A sintered silicide substance having a diameter of 260 mm was ground and lapped in the same manner as the embodiment 200, and was then polished with an acrylic resin polisher and 0.3 μm celium oxide abrasive grains for 10 hrs under conditions of polisher pressure of 1 kg/cm², and polisher speed of 10 m/min. The working solution was removed by ultrasonic cleaning, and the polished surface was thereafter degreased by aceton and was dried, thereby finishing the target.

As a result of observation of the worked surface by an SEM, work defect layers having grinding streaks, dropped-out holes and fine cracks caused by grinding were completely eliminated, and the surface was finished in a mirror-like state. The results of measurements of the surface roughness and the residual stress in the worked surface are also shown in Table 3. Irregularities in the worked surface were extremely small as compared with the ground surface shown as reference example 200, and plastic or elastic deformations of the surface caused by grinding were removed almost entirely.

Magnetron sputtering was effected by use of this target to form a silicide thin film on a five inch wafer. The result of the measurement of the amount of particles mixed in the film is also shown in Table 3. As is apparent from the result, it was confirmed that the amount of particles separated from the target could be remarkably reduced by the improvement in the surface property attained by polishing performed as final finishing.

EMBODIMENT 202

A sintered silicide substance having a diameter of 260 mm was ground and lapped in the same manner as the embodiment 200, and was then polished in a mechano-chemica polishing manner by use of a cloth polisher and $SiO_2$ powder of 0.02 μm for 20 hrs under a polisher pressure of 1 kg/cm$^2$ and polisher speed of 10 m/min. After ultrasonic cleaning, the polished surface was degreased by aceton and dried, thereby finishing a target.

As a result of SEM observation of the worked surface, no work-defect layers caused by grinding were recognized, and the degree of smoothness was extremely high in comparison with the ground surface with respect to the surface roughness and the residual stress, so that the worked surface was equivalent to a non-distortion surface.

Magnetron sputtering was also effected by use of this target to form a silicide thin film on a 5 inch Si wafer, and the amount of particles mixed in the thin film was measured. As a result, as shown in Table 3, substantially no particles were recognized, and it was confirmed that the work-defect layers and the residual stresses causing separation of particles could be completely removed by the final finishing.

TABLE 3

|  | Surface roughness Ra (μm) | Residual compressive stress (kg/mm$^2$) | Amount of generated particles (No.) |
| --- | --- | --- | --- |
| Embodiment 200 | 0.010 | 2.4 | 18 |
| Embodiment 201 | 0.007 | 1.5 | 12 |
| Embodiment 202 | 0.002 | 0.5 | 5 |
| Reference example 200 | 0.82 | 12.3 | 250 |

Industrial Applicability:

According to the sputtering target and the manufacturing method of the sputtering target, a target of high density and having high strength and minute structure, and therefore capable of substantially preventing generation of particles can be provided and therefor it is extremely advantageous for providing a thin film adapted to provide electrodes and wirings of semiconductor devices.

What is claimed is:

1. A silicide film having a carbon content of less than 100 ppm manufactured by depositing material removed from a sputtering target on a substrate, wherein said sputtering target comprises a metal silicide phase comprising a metal silicide having a stoichiometric composition $MSi_2$, where M is a metal, coupled in link form so as to provide a metal silicide phase and an Si phase comprising Si grains dispersed in the gaps of the metal silicide phase discontinuously so as to provide a compact mixed structure of the target, and wherein a carbon content of the mixed structure is less than 100 ppm.

2. The silicide film according to claim 1, wherein metal silicide grains of a number falling in a range of from 400 to 400×10$^4$, each grain having a grain diameter in a range of from 5 to 30 μm, are provided in a sectional area of 1 mm$^2$ of the mixed structure of the target, a maximum grain diameter of said Si grains contained in the target being less than 30 μm.

3. The silicide film according to claim 1, wherein an average diameter of said metal silicide grains contained in the target is held in a range of from 2 to 15 μm, while the average diameter of the Si grains contained in the target is held in a range of from 2 to 10 μm.

4. The silicide film according to claim 1, wherein the density ratio of the target is more than 99%.

5. The silicide film according to claim 1, wherein the oxygen content of the target is less than 150 ppm.

6. The silicide film according to claim 1, wherein the metal for forming the metal silicide of the target is at least one metal selected from a group consisting of tungsten, molybdenum, titanium, zirconium, hafnium, niobium, tantalum, vanadium, cobalt, chromium, and nickel.

7. The silicide film according to claim 1, wherein an interface layer is formed between the metal silicide phase and the Si phase of the target.

8. The silicide film according to claim 7, wherein the thickness of the interface layer formed between the metal silicide phase and the Si phase of the target is set in a range of from 100 to 10,000 Å.

9. The silicide film according to claim 1, wherein said Si phase of the target further comprises at least one element selected from a group consisting of B, P, Sb and As, and wherein an electric resistivity of the Si phase is in a range of from 0.01 to 100 Ω. cm.

10. A silicide film according to claim 1, wherein a number of particles mixed in the silicide film is 39 or less when the silicide film is manufactured by depositing material removed from the sputtering target on a 5-inch wafer as the substrate.

11. A semiconductor device having an electrode and wiring, characterized in that the electrode and wiring are formed of a silicide film having a carbon content of less than 100 ppm which is manufactured by depositing material removed from a sputtering target on a substrate, wherein said sputtering target comprises a metal silicide phase comprising a metal silicide having a stoichiometric composition $MSi_2$, where M is a metal, coupled in link form so as to provide a metal silicide phase; and an Si phase comprising Si grains dispersed in the gaps of the metal silicide phase discontinuously so as to provide a compact mixed structure of the target, and wherein a carbon content of the mixed structure is less than 100 ppm.

12. The semiconductor device according to claim 11, wherein metal silicide grains of a number falling in a range of from 400 to 400×10$^4$ each grain having a grain diameter in a range of from 5 to 30 μm, are provided in a sectional area of 1 mm$^2$ of the mixed structure of the target, a maximum grain diameter of said Si grains being less than 30 μm.

13. The semiconductor device according to claim 11, wherein an average diameter of said metal silicide grains contained in the target is held in a range of from 2 to 15 μm, while the average diameter of the Si grains contained in the target is held in a range of from 2 to 10 μm.

14. The semiconductor device according to claim 11, wherein the density ratio of the target is more than 99%.

15. The semiconductor device according to claim 11, wherein the oxygen content of the target is less than 150 ppm.

16. The semiconductor device according to claim 11, wherein the metal for forming the metal silicide of the target is at least one metal selected from a group consisting of tungsten, molybdenum, titanium, zirconium, hafnium, niobium, tantalum, vanadium, cobalt, chromium, and nickel.

17. The semiconductor device according to claim 11, wherein an interface layer is formed between the metal silicide phase and the Si phase of the target.

18. The semiconductor device according to claim 17, wherein the thickness of the interface layer formed between the metal silicide phase and the Si phase of the target is set in a range of from 100 to 10,000 Å.

19. The semiconductor device according to claim 11, wherein said Si phase of the target further comprises at least one element selected from the group consisting of B, P, Sb and As, and wherein an electric resistivity of the Si phase of the target is in a range of from 0.01 to 100 $\Omega$. cm.

20. A semiconductor device according to claim 11, wherein a number of particles mixed in the silicide film is 39 or less when the silicide film is manufactured by depositing material removed from the sputtering target on a 5-inch wafer as the substrate.

* * * * *